US012592691B2

(12) United States Patent
Fukuda et al.

(10) Patent No.: US 12,592,691 B2
(45) Date of Patent: Mar. 31, 2026

(54) MOTOR DRIVING DEVICE

(71) Applicant: Nuvoton Technology Corporation Japan, Kyoto (JP)

(72) Inventors: Daisuke Fukuda, Kyoto (JP); Takuya Ishii, Osaka (JP); Toru Kawanishi, Nara (JP); Masahiro Takahashi, Kyoto (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 215 days.

(21) Appl. No.: 18/656,083

(22) Filed: May 6, 2024

(65) Prior Publication Data

US 2024/0291477 A1     Aug. 29, 2024

Related U.S. Application Data

(63) Continuation of application No. PCT/JP2022/041378, filed on Nov. 7, 2022.

(30) Foreign Application Priority Data

Nov. 19, 2021     (JP) ................................. 2021-189003

(51) Int. Cl.
 H02H 9/00        (2006.01)
 H03K 17/0812     (2006.01)
 H03K 17/30       (2006.01)

(52) U.S. Cl.
 CPC ..... H03K 17/08122 (2013.01); H03K 17/302 (2013.01); H03K 2217/0063 (2013.01); H03K 2217/0072 (2013.01)

(58) Field of Classification Search
 IPC .................................................. H03K 17/08122
 See application file for complete search history.

(56) References Cited

U.S. PATENT DOCUMENTS 10,862,479 B2 * 12/2020 Yoshida ............... H03K 3/0375
2014/0217942 A1 * 8/2014 Fukuta .............. H02M 7/53875
                                                       318/400.27

(Continued)

FOREIGN PATENT DOCUMENTS

JP        H10-070897 A      3/1998

OTHER PUBLICATIONS

International Search Report dated Jan. 24, 2023 issued in International Patent Application No. PCT/JP2022/041378, with English translation.

*Primary Examiner* — Stephen W Jackson
(74) *Attorney, Agent, or Firm* — Rimon P.C.

(57)        ABSTRACT

A motor driving device includes: a series circuit of a Zener diode and a detection resistor, connected between a gate terminal and a ground of a first high-side transistor; a comparator that compares a voltage of the detection resistor with a reference voltage; a first driving transistor that short-circuits between the gate and source terminals of the first high-side transistor, using a detection signal output by the comparator; a control circuit; and an OR circuit that puts the first driving transistor into an open state regardless of a drive signal from the control circuit. The motor driving device puts the first high-side transistor into a conducting state when a power supply voltage increases and the gate terminal of the first high-side transistor reaches or exceeds a predetermined voltage, to inhibit an increase in the power supply voltage.

9 Claims, 5 Drawing Sheets

(56) References Cited

U.S. PATENT DOCUMENTS

| | | | |
|---|---|---|---|
| 2017/0237356 A1* | 8/2017 | Chen ................. | H02M 3/33553 |
| | | | 363/21.02 |
| 2019/0006934 A1* | 1/2019 | Nakashima ............. | H02M 1/44 |
| 2020/0195190 A1* | 6/2020 | Horiuchi ............... | H02P 29/032 |

* cited by examiner

MOTOR DRIVING DEVICE

CROSS REFERENCE TO RELATED APPLICATIONS

This is a continuation application of PCT International Application No. PCT/JP2022/041378 filed on Nov. 7, 2022, designating the United States of America, which is based on and claims priority of Japanese Patent Application No. 2021-189003 filed on Nov. 19, 2021. The entire disclosures of the above-identified applications, including the specifications, drawings and claims are incorporated herein by reference in their entirety.

FIELD

The present disclosure relates to a motor driving device having a function of overvoltage protection.

BACKGROUND

Conventionally, motor driving devices having a function of overvoltage protection have been proposed (for example, see Patent Literature (PTL) 1).

In PTL 1, a motor driving device includes a main circuit that controls the forward and backward rotation of a motor through an H-type bridge circuit including four switching elements, and two protective circuits provided in the main circuit. When a relay RY connecting a battery and the main circuit is opened and, for example, the motor is rotated forward by external force, an induced voltage generated in the motor increases the electric potential at a connecting point of two switching elements on the high side and the low side, and eventually charges a capacitor connected to the main circuit side of the relay via the body diodes of the switching elements. When the applied voltage to the low-side switching element, i.e., the electric potential at the above-described connecting point, exceeds a predetermined value, the Zener diode of the protective circuit breaks down and current flows through the resistor connected in series with the Zener diode. The voltage generated in the resistor by this current drives the low-side switching element, putting the low-side switching into a conducting state. This allows current to flow out of the motor through the low-side switching element and inhibits the increase in electric potential at the above-described connecting point, preventing the application of overvoltage to the switching elements on the high side and the low side.

CITATION LIST

Patent Literature

PTL 1: Japanese Unexamined Patent Application Publication No. 10-70897

SUMMARY

Technical Problem

In the above-described conventional technique, when the relay is opened and the main circuit is disconnected from the battery, and the motor is rotated by external force to generate an induced voltage, the application of overvoltage to the switching element is inhibited. In the normal state in which no induced voltage is generated, the drive signal output by the protective circuit to the low-side switching element is at a level L (low). In other words, the low-side switching element is not put into a conducting state. In reality, however, the applied voltage to the switching element due to the regenerative electric power of the motor increases regardless of whether the relay is in a conducting or opened state, and even while the main circuit is operating. However, with the above-described conventional technique, it is not possible to inhibit the increase in the applied voltage to the switching element due to such regenerative electric power. In particular, while the main circuit is operating, there is a drive signal from the control circuit to the switching element, and thus the method of simply providing a protective circuit to drive the switching element as in PTL 1 has a problem that it is not possible to inhibit an increase in the applied voltage to the switching element due to the regenerative electric power.

In view of the above, the present disclosure provides a motor driving device that is capable of inhibiting an increase in the applied voltage to the switching element due to the regenerative electric power.

Solution to Problem

In view of the above, a motor driving device according to one aspect of the present disclosure includes: a bridge circuit that includes a plurality of series circuits connected between a power supply line and a ground, and is connected to a motor at a middle connecting point of each of the plurality of series circuits, the plurality of series circuits each being a series circuit of a high-side switching element and a low-side switching element. In the motor driving device, the high-side switching element includes a first terminal, a second terminal, and a control terminal, and has a function of making an electrical connection between the first terminal and the second terminal when a voltage greater than or equal to a predetermined threshold is applied between the first terminal and the control terminal, the first terminal being connected to the power supply line, the second terminal being connected to the low-side switching element, and the motor driving device further includes: a control circuit that outputs a drive signal for driving at least the high-side switching element; a voltage detection circuit that is connected between the control terminal of the high-side switching element and the ground, is put into a conducting state when a voltage between the control terminal of the high-side switching element and the ground reaches or exceeds a first predetermined value, and outputs a detection signal that is put into a first state when the voltage between the control terminal of the high-side switching element and the ground reaches or exceeds a second predetermined value; a driving switch that is connected between the first terminal and the control terminal of the high-side switching element, and opens or closes according to the drive signal; and a logic circuit that puts the driving switch into an open state regardless of the drive signal when the detection signal from the voltage detection circuit is put into the first state.

Advantageous Effects

With a motor driving device according to the present disclosure, it is possible to inhibit an increase in the applied voltage to the switching element due to the regenerative electric power of the motor, etc., by inhibiting an increase in the power supply voltage.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 1 is a circuit block diagram illustrating a motor driving device according to a first working example.

FIG. 3 is a circuit block diagram illustrating a motor driving device according to a second working example.

DESCRIPTION OF EMBODIMENTS

Figure 2:
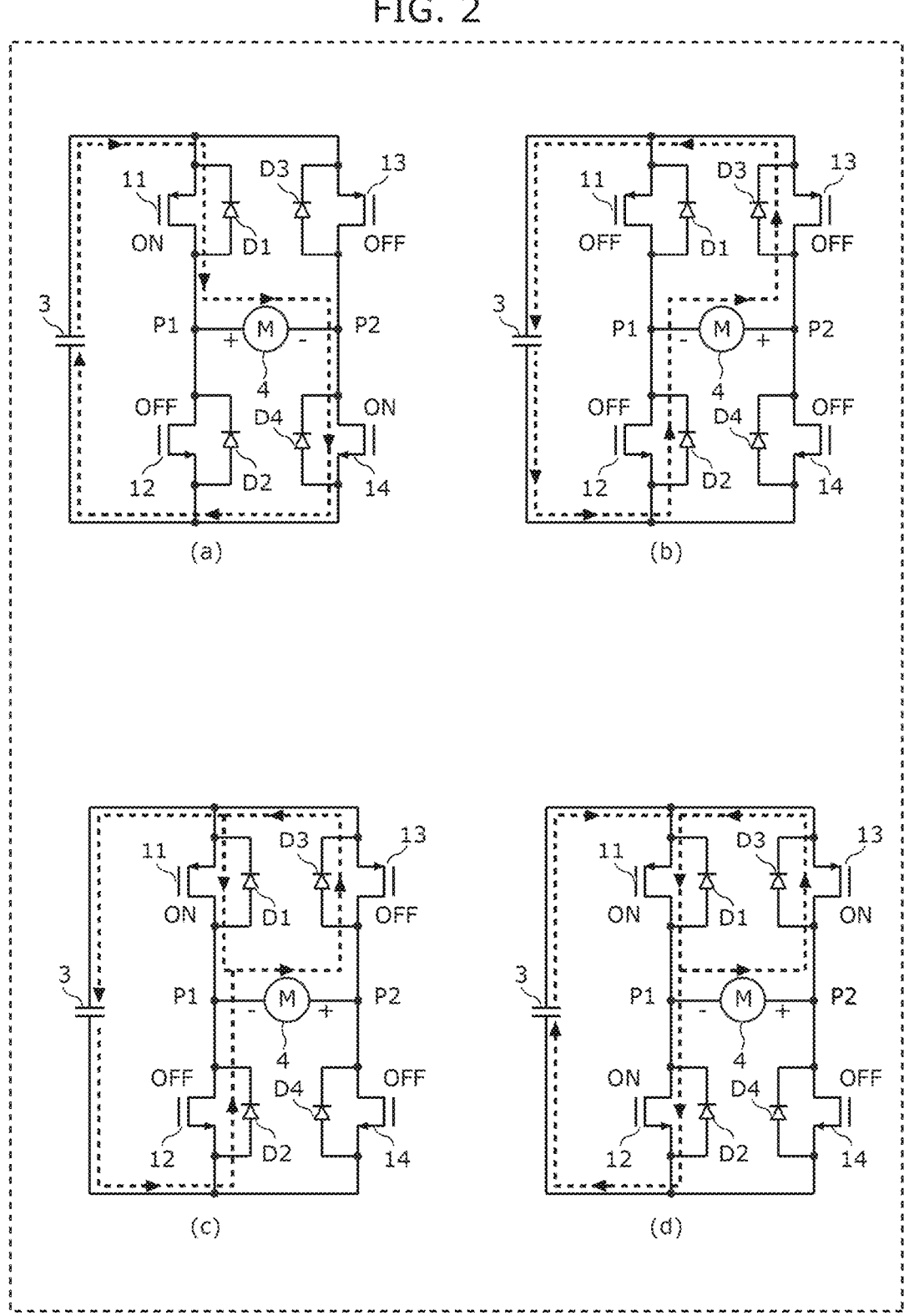
FIG. 2 is a diagram illustrating an on/off operation of the motor driving device according to the first working example.

A motor driving device according to the present disclosure has a feature in including a voltage detection circuit, a logic circuit, and a driving switch which are for putting a switching element on a high side or a low side in a state in which the switching element easily changes from an off-state to an on-state when the voltage of a power supply line increases to the first threshold or higher, and turning on the switching element when the voltage of the power supply line further increases to the second threshold or higher. With this configuration, unlike the conventional technique, the voltage increase in the power supply line due to the regenerative electric power of the motor, etc., is inhibited even while the main circuit is operating, and thus the increase in the applied voltage to the switching element is inhibited. The following describes, as three working examples, three specific types of motor driving devices determined by the combination of the position of the switching element to be controlled (high side/low side) and the type of the switching element to be controlled (P-channel transistor/N-channel transistor), with reference to the drawings. Each of the working examples described below shows one specific example of the motor driving device according to the embodiment of the present disclosure. The numerical values, shapes, materials, circuit components, the arrangement and connection of the circuit components, and so on, shown in the following working examples are mere examples, and therefore do not limit the present disclosure. In addition, the respective diagrams are not necessarily precise illustrations. In each of the diagrams, substantially the same structural components are assigned with the same reference signs, and redundant descriptions will be omitted or simplified. In the present disclosure, the conducting state in the switching operation of a transistor is also referred to as "on", "ON", or "closed state", and the non-conducting state is also referred to as "off", "OFF", or "open state".

First Working Example

Figure 1:
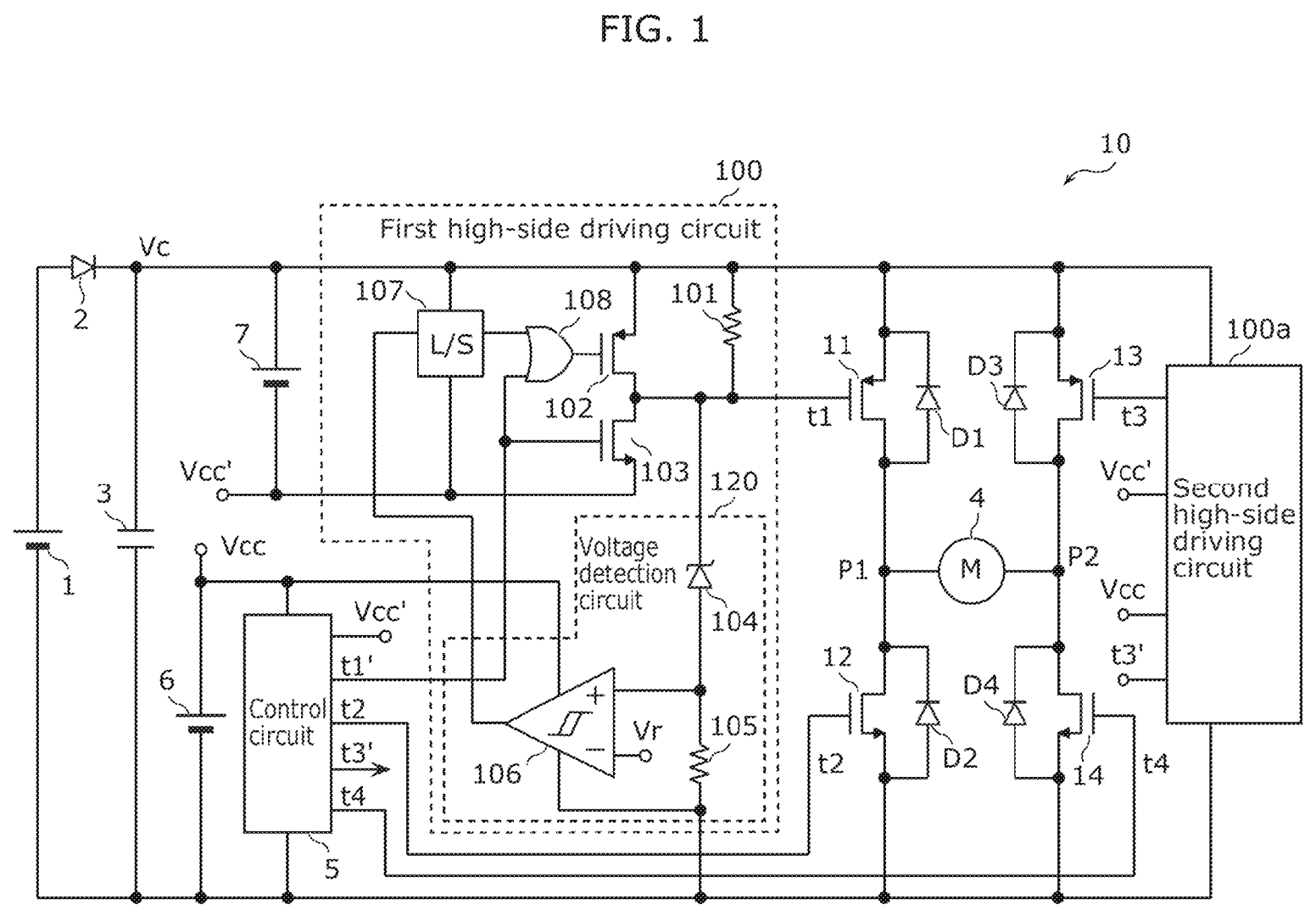

FIG. 1 is a circuit block diagram illustrating motor driving device 10 of a first working example according to the present disclosure. Motor driving device 10 is a device that drives motor 4. In FIG. 1, motor driving device 10 is connected to input power supply 1 such as a battery and includes diode 2 for protection against battery reverse connection and capacitor 3. The voltage of capacitor 3 is denoted by Vc. It should be noted that input power supply 1 may be an AC power supply and diode 2 may be a bridge diode. Motor driving device 10 also includes control circuit 5 and receives power supply from control-circuit power supply 6. The voltage of control-circuit power supply 6 is denoted by Vcc. Motor driving device 10 also receives power supply from high-side driving power supply 7. High-side driving power supply 7 is a negative power supply with the positive electrode of capacitor 3 being the reference potential. The voltage of high-side driving power supply 7 is denoted by Vcc'.

Motor driving device 10 includes a bridge circuit that includes a plurality of pairs of series circuits of a high-side switching element and a low-side switching element connected between the power supply line and the ground, and an inductive load (motor 4) is connected to a middle connecting point of each of the series circuits. More specifically, the bridge circuit includes first high-side transistor 11 that is a P-channel metal-oxide semiconductor field-effect transistor (MOSFET), first low-side transistor 12 that is an N-channel MOSFET, second high-side transistor 13 that is a P-channel MOSFET, and second low-side transistor 14 that is an N-channel MOSFET. It should be noted that first high-side transistor 11, first low-side transistor 12, second high-side transistor 13, and second low-side transistor 14 are each hereinafter also referred to simply as a "transistor". Transistors 11 to 14 include body diodes D1 to D4, respectively, and constitute an H-bridge driving circuit that drives motor 4 using voltage Vc of capacitor 3 as the power supply voltage. Hereafter, the positive electrode of capacitor 3 of power supply voltage Vc is referred to as the power supply line, and the negative electrode of capacitor 3 which is the reference potential of the H-bridge driving circuit is referred to as the ground. The connecting point between first high-side transistor 11 and first low-side transistor 12 is denoted by P1, and the connecting point between second high-side transistor 13 and second low-side transistor 14 is denoted by P2.

Control circuit 5 operates at control-circuit power supply voltage Vcc and outputs drive signals t1', t2, t3', and t4 to the respective transistors 11 to 14. Drive signal t1' is a pre-drive signal to first high-side transistor 11 (hereinafter also referred to as pre-drive signal t1'), drive signal t2 is a drive signal to first low-side transistor 12, drive signal t3' is a pre-drive signal to second high-side transistor 13 (hereinafter also referred to as pre-drive signal t3'), and drive signal t4 is a drive signal to second low-side transistor 14. Pre-drive signal t1' and pre-drive signal t3' are signals with high-side driving power supply voltage Vcc' being the reference potential. Pre-drive signal t1' and pre-drive signal t3' are level-shifted in control circuit 5 and output. Motor driving device 10 includes first high-side driving circuit 100 and second high-side driving circuit 100a. First high-side driving circuit 100 turns on/off first high-side transistor 11 by receiving pre-drive signal t1'. Second high-side driving circuit 100a turns on/off second high-side transistor 13 by receiving pre-drive signal t3'.

First high-side driving circuit 100 includes: resistor 101 connected between a gate and a source of first high-side transistor 11; first driving transistor 102 that is a P-channel MOSFET and is connected so as to short-circuit between the source terminal and the gate terminal of first high-side transistor 11; second driving transistor 103 that is an N-channel MOSFET and is connected so as to short-circuit between the gate terminal and high-side driving power supply 7 of first high-side transistor 11. First driving transistor 102 is one example of a driving switch that is connected between the first terminal and the control terminal of the high-side switching element, and opens or closes according to a drive signal.

First high-side driving circuit 100 also includes: a series circuit of Zener diode 104 with Zener voltage Vz1 and detection resistor 105 connected between the gate terminal of first high-side transistor 11 and the ground; and comparator 106. The connecting point between Zener diode 104 and detection resistor 105 is connected to a positive input terminal of comparator 106. Although not illustrated in the diagram, voltage Vr is a reference voltage generated from control-circuit power supply 6 and applied to a negative input terminal of comparator 106. Zener diode 104, detection resistor 105, and comparator 106 constitute voltage detection circuit 120 that is put into a conducting state when the voltage between the control terminal of the high-side switching element and the ground reaches or exceeds a first predetermined value, and outputs a detection signal that is put into the first state when the voltage between the control terminal of the high-side switching element and the ground reaches or exceeds a second predetermined value.

First high-side driving circuit 100 also includes level-shift circuit 107. The output of comparator 106 which operates at control-circuit power supply voltage Vcc is converted to high-side driving power supply voltage Vcc' through level-shift circuit 107. Pre-drive signal t1' is connected to the gate terminal of second driving transistor 103. First high-side driving circuit 100 also includes OR circuit 108 to which pre-drive signal t1' and the output signal of level-shift circuit 107 are input. The output of OR circuit 108 is connected to the gate terminal of first driving transistor 102. OR circuit 108 is one example of a logic circuit that puts the driving switch into an open state regardless of the drive signal when the detection signal from voltage detection circuit 120 is put into the first state.

The configuration of second high-side driving circuit 100a is equivalent to the configuration of first high-side driving circuit 100, and thus detailed illustrations and explanations will be omitted.

The operation of motor driving device 10 configured as described above will be explained with reference to FIG. 2 which illustrates the on/off operation of motor driving device 10. In FIG. 2, (a) illustrates a state in which first high-side transistor 11 and second low-side transistor 14 are in the on-state, and current is flowing through the path from the power supply line (the positive electrode of capacitor 3) via first high-side transistor 11, motor 4, and second low-side transistor 14 to the ground (the negative electrode of capacitor 3). Motor 4 which is an inductive load and includes a coil is excited and energy is stored. Capacitor 3 is discharged, but is supplied with power from input power supply 1 via diode 2. When first high-side transistor 11 and second low-side transistor 14 are turned off by a conducting phase switching operation, the applied voltage to motor 4 is inverted, and as illustrated in (b) in FIG. 2, the regenerative current flows through the path from the ground, via first low-side transistor 12 (body diode D2), motor 4, second high-side transistor 13 (body diode D3), to the power supply line to charge capacitor 3. When the regenerative operation associated with the switching operation described above is repeated, power supply voltage Vc and the potential of point P2 increase, and may possibly exceed the breakdown voltage of first high-side transistor 11 and second low-side transistor 14 to which power supply voltage Vc is applied. In view of the above, in the present working example, as illustrated in (c) in FIG. 2, first high-side transistor 11 is forced to be in a conducting state when power supply voltage Vc exceeds a predetermined value to create a loop for discharging capacitor 3, thereby inhibiting the increase in power supply voltage Vc. In FIG. 2, (d) illustrates the case where first low-side transistor 12 and second high-side transistor 13 are in the on-state, and the discharge current flowing through first high-side transistor 11 exceeds the regenerative current, discharging capacitor 3 and causing power supply voltage Vc to change to decrease.

The following describes the operation of motor driving device 10 according to the present working example illustrated in FIG. 1 to put first high-side transistor 11 into a conducting state when power supply voltage Vc exceeds a predetermined value.

First, when power supply voltage Vc is a normal value that is less than or equal to Zener voltage Vz1 of Zener diode 104, no voltage is generated in detection resistor 105, the output of comparator 106 is at level L, and the output of level-shift circuit 107 to be input to OR circuit 108 is also at level L. Accordingly, a signal voltage according to pre-drive signal t1' is applied to the gate terminal of first driving transistor 102 in the same manner as second driving transistor 103.

In the state illustrated in (b) of FIG. 2, pre-drive signal t1' is at level L, first driving transistor 102 is in the on-state, and second driving transistor 103 is in the off-state. Accordingly, first high-side transistor 11 is in the off-state and power supply voltage Vc is applied to first high-side transistor 11. When power supply voltage Vc increases and exceeds Zener voltage Vz1 of Zener diode 104 (i.e., when the voltage between the control terminal of the high-side switching element and the ground reaches or exceeds a first predetermined value), a current flows from the power supply line to the ground through first driving transistor 102, Zener diode 104, and detection resistor 105, generating a voltage in detection resistor 105. When the voltage in detection resistor 105 exceeds reference voltage Vr (in other words, when the voltage between the control terminal of the high-side switching element and the ground reaches or exceeds a second predetermined value) as a result of the increase in power supply voltage Vc, the output of comparator 106 is inverted from level L to level H (high) (first state). The output of comparator 106 inverted to level H is input to OR circuit 108 via level-shift circuit 107, and the output of OR circuit 108 is inverted from level L to level H, and first driving transistor 102 is put into an off-state. This causes the current flowing in first driving transistor 102 to flow from the power supply line to the ground through resistor 101, Zener diode 104, and detection resistor 105. As a result, a voltage is generated between the source and the gate of first high-side transistor 11. When this voltage reaches a gate threshold of first high-side transistor 11, first high-side transistor 11 is put into a conducting state and enters the state illustrated in (c) of FIG. 2, creating a loop that discharges capacitor 3 to inhibit the increase in power supply voltage Vc. As a result, the increase in the applied voltage to the switching elements included in the bridge circuit due to regenerative electric power is inhibited.

In the above-described operations, when the power supply voltage is denoted by Vc, the resistance value of resistor 101 is denoted by R1, the resistance value of detection resistor 105 is denoted by R5, and the gate threshold of first high-side transistor 11 is denoted by Vgth, the relationships between the events and voltage Vc are summarized as follows:

Zener diode 104 and detection resistor 105 are electrically connected: Vc=Vz1;

Comparator 106 is inverted and first driving transistor 102 is turned off: Vc=Vz1+Vr; and First high-side transistor 11 is in a conducting state: Vc=Vz1+(1+R5/R1) Vgth.

At this time, when first low-side transistor 12 is in the on-state by control circuit 5, the discharge current flowing through first high-side transistor 11 exceeds the regenerative current of motor 4, and power supply voltage Vc turns from increase to decrease as a result of the discharge of capacitor 3 as illustrated in (d) in FIG. 2. This causes the voltage between the source and the gate of first high-side transistor 11 to also decrease, and when the voltage falls below the gate threshold voltage, first high-side transistor 11 is put into an off-state. As a result, the discharge current of capacitor 3 flowing through first high-side transistor 11 is inhibited from becoming excessive.

It should be noted that, when first driving transistor 102 is turned off, the difference voltage between power supply voltage Vc and Zener voltage Vz1 is divided between resistor 101 and detection resistor 105, and thus the voltage of detection resistor 105 decreases. Comparator 106, for example, has hysteresis characteristics so that this decrease does not cause the output of comparator 106 to return to level L.

When the operation of motor 4 is in the reverse phase, the operating current indicated in FIG. 2 is also reversed, and power supply voltage Vc which is charged during the conducting phase switching operation is applied to second high-side transistor 13 and first low-side transistor 12. In this case, second high-side driving circuit 100a operates to put second high-side transistor 13 into a conducting state, thereby inhibiting the increase in power supply voltage Vc. As a result, the increase in the applied voltage to the switching elements included in the bridge circuit due to regenerative electric power is inhibited.

As described above, motor driving device 10 according to the present working example includes: a bridge circuit that includes a plurality of series circuits connected between a power supply line (power supply voltage Vc) and a ground, and is connected to motor 4 at a middle connecting point of each of the plurality of series circuits, the plurality of series circuits each being a series circuit of a high-side switching element (first high-side transistor 11, etc.) and a low-side switching element (first low-side transistor 12, etc.). In motor driving device 10 according to the present working example, the high-side switching element includes a first terminal (source terminal), a second terminal (drain terminal), and a control terminal (gate terminal), and has a function of making an electrical connection between the first terminal and the second terminal when a voltage greater than or equal to a predetermined threshold is applied between the first terminal and the control terminal, the first terminal being connected to the power supply line, the second terminal being connected to the low-side switching element, and motor driving device 10 further includes: control circuit 5 that outputs a drive signal for driving at least the high-side switching element; voltage detection circuit 120 that is connected between the control terminal of the high-side switching element and the ground, is put into a conducting state when a voltage between the control terminal of the high-side switching element and the ground reaches or exceeds a first predetermined value, and outputs a detection signal that is put into a first state when the voltage between the control terminal of the high-side switching element and the ground reaches or exceeds a second predetermined value; a driving switch (first driving transistor 102) that is connected between the first terminal and the control terminal of the high-side switching element, and opens or closes according to the drive signal; and a logic circuit (OR circuit 108) that puts the driving switch into an open state regardless of the drive signal when the detection signal from the voltage detection circuit is put into the first state.

According to this configuration, when the voltage of the power supply line exceeds a predetermined value due to regenerative electric power, the high-side switching element is forced to be in a conducting state, and thus the voltage of the power supply line is inhibited from increasing. As a result, an increase in the applied voltage to the switching elements included in the bridge circuit is inhibited.

In addition, voltage detection circuit 120 includes: a series circuit of a first constant voltage device (Zener diode 104) having a first predetermined value and detection resistor 105; and comparator 106 that compares an electric potential at a connecting point between the first constant voltage device and detection resistor 105 with predetermined reference voltage Vr, and outputs the detection signal. According to this configuration, it is possible to inhibit an increase in the applied voltage to the switching elements due to regenerative electric power, with a simple circuit.

Second Working Example

Figure 3:
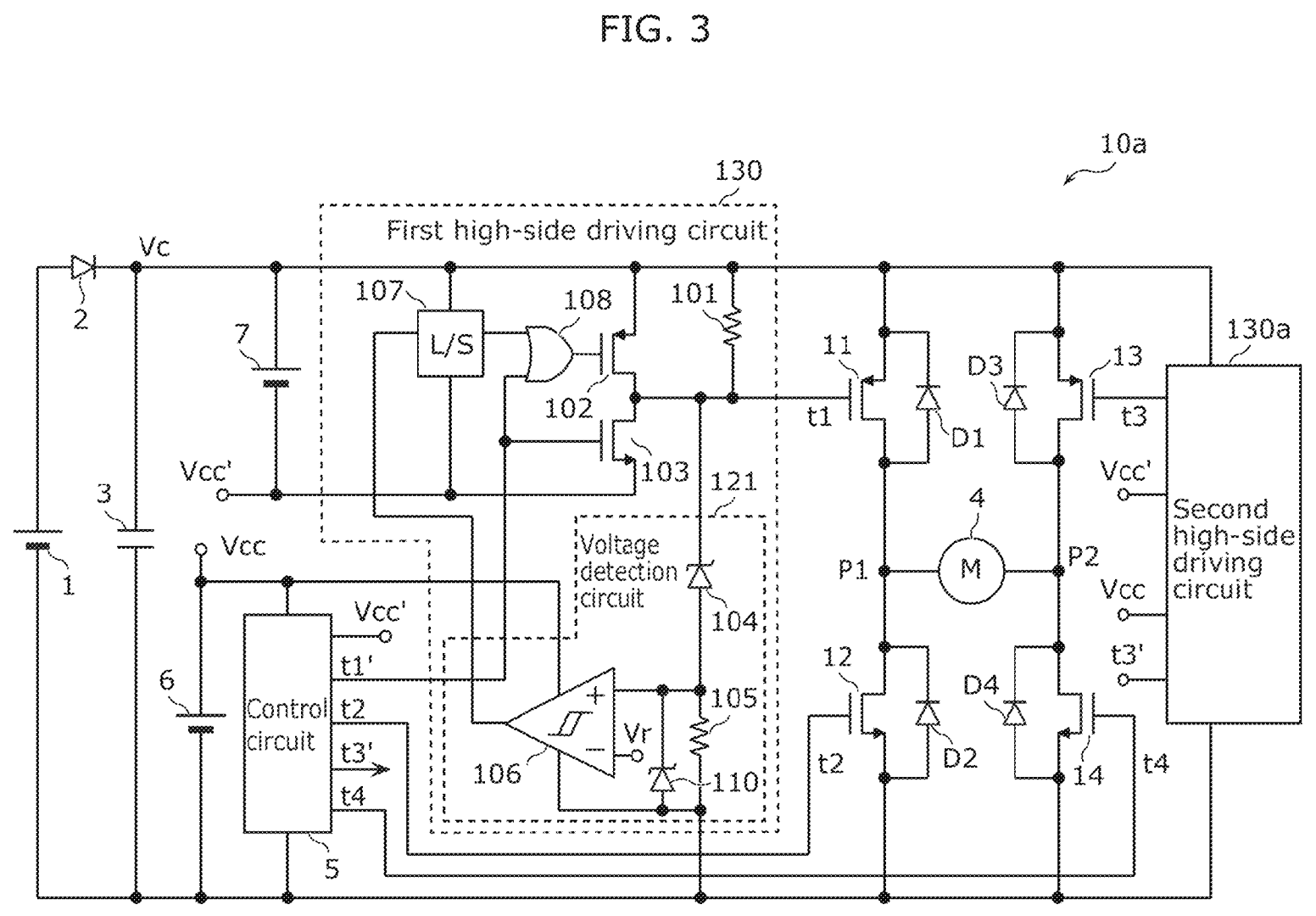

FIG. 3 is a circuit block diagram illustrating motor driving device 10a according to a second working example. In FIG. 3, the same structural components are assigned with the same reference signs as in FIG. 1, and redundant descriptions will be omitted. The difference is that Zener diode 110 included in voltage detection circuit 121 is connected in parallel with detection resistor 105, and Zener voltage Vz0 of Zener diode 110 is set higher than reference voltage Vr. In other words, first high-side driving circuit 130 of the present working example includes voltage detection circuit 121 to which Zener diode 110 connected in parallel with detection resistor 105 is added. In the same manner, second high-side driving circuit 130a includes a voltage detection circuit to which a Zener diode connected in parallel with a detection resistor is added. The following describes the operation of motor driving device 10a according to the present working example to put first high-side transistor 11 into a conducting state when power supply voltage Vc exceeds a predetermined value.

First, when power supply voltage Vc is less than or equal to Zener voltage Vz1 of Zener diode 104, no voltage is generated in detection resistor 105 and Zener diode 110. When power supply voltage Vc exceeds Zener voltage Vz1 of Zener diode 104 (in other words, when the voltage between the power supply line and the control terminal of the low-side switching element reaches or exceeds the first predetermined value), a current flows from the power supply line through first driving transistor 102, Zener diode 104, and detection resistor 105 to the ground, generating voltage at detection resistor 105 and Zener diode 110. When this voltage is less than or equal to reference voltage Vr, the output of comparator 106 is at level L, and the output of level-shift circuit 107 which is input to OR circuit 108 is also at level L. Accordingly, a signal voltage according to pre-drive signal t1' is applied to the gate terminal of first driving transistor 102 in the same manner as second driving transistor 103.

When the voltages in detection resistor 105 and Zener diode 110 exceed reference voltage Vr (in other words, when the voltage between the power supply line and the control terminal of the low-side switching element reaches or exceeds the second predetermined value) as a result of the increase in power supply voltage Vc, comparator 106 inverts the output from level L to level H (first state). The output of comparator 106 inverted to level H is input to OR circuit 108 via level-shift circuit 107, the output of OR circuit 108 is inverted from level L to level H, and first driving transistor 102 is put into an off-state. This causes the current flowing in first driving transistor 102 to flow from the power supply line to the ground through resistor 101, Zener diode 104, and detection resistor 105. As a result, a voltage is generated between the source and the gate of first high-side transistor 11. Eventually, Zener diode 110 is also put into a conducting state, and when the voltage between the source and the gate of first high-side transistor 11 reaches the gate threshold of first high-side transistor 11, first high-side transistor is put into a conducting state. In the first working example, power supply voltage Vc at this time is Vc=Vz1+(1+R5/R1) Vgth. In the present working example, however, power supply voltage Vc at this time is Vc=Vz1+Vz0+Vgth, and thus is unaffected by a resistance value. Furthermore, the subsequent increase in power supply voltage Vc is added to the gate voltage of first high-side transistor 11, and thus the on-resistance between the source and the drain of first high-side transistor 11 rapidly decreases, thereby increasing the discharge current. Thus, the effect of inhibiting the increase in power supply voltage Vc is enhanced. As a result, the increase in the applied voltage to the switching elements included in the bridge circuit due to regenerative power is more reliably inhibited.

As described above, in motor driving device 10a according to the present working example, voltage detection circuit 121 includes, in addition to voltage detection circuit 120 of the first working example, a second constant voltage device (Zener diode 110) that is connected in parallel with detection resistor 105, and has a voltage higher than predetermined reference voltage Vr. According to this configuration, when the voltage of the power supply line exceeds a predetermined value due to the regenerative electric power, the high-side switching element is forced to put into a conducting state more rapidly, thereby more reliably inhibiting the increase in the voltage of the power supply line.

Third Working Example

In the first and second working examples, power supply voltage Vc is discharged by putting the first high-side transistor or the second high-side transistor into a conducting state, but the increase in power supply voltage Vc can also be inhibited by putting the low-side transistor into a conducting state.

Figure 4:
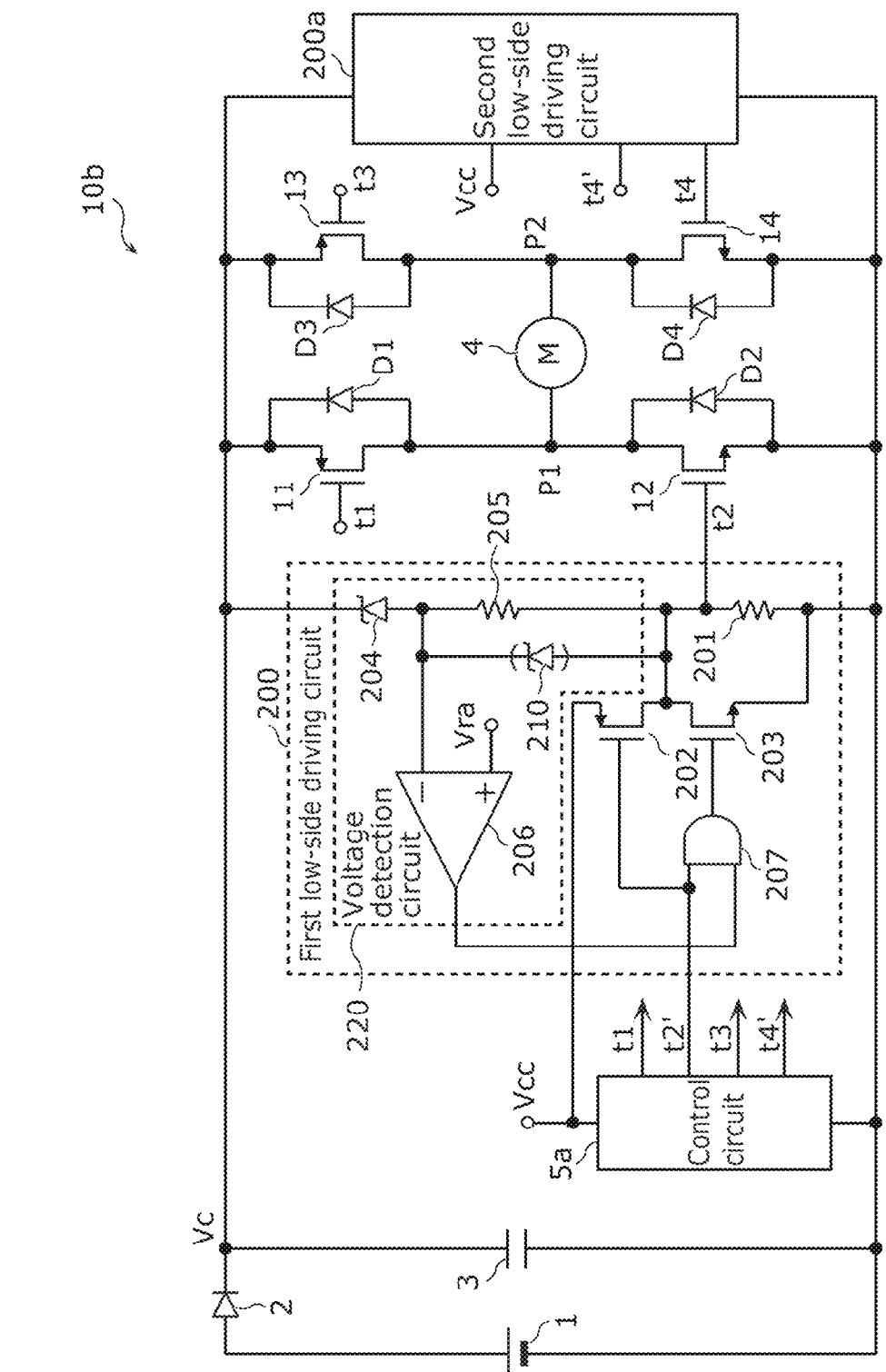
FIG. 4 is a circuit block diagram illustrating a motor driving device according to a third working example.

FIG. 4 is a circuit block diagram illustrating motor driving device 10b according to a third working example. In FIG. 4, the same structural components are assigned with the same reference signs as in FIG. 1, and redundant descriptions will be omitted. The difference is that control circuit 5 illustrated in FIG. 1 is control circuit 5a, and first low-side driving circuit 200 and second low-side driving circuit 200a are provided instead of first high-side driving circuit 100 and second high-side driving circuit 100a illustrated in FIG. 1.

In addition, control-circuit power supply 6 and high-side driving power supply 7 are not illustrated in the diagram, and only control-circuit power supply voltage Vcc is illustrated. Control circuit 5a operates at control-circuit power supply voltage Vcc and outputs drive signals t1, t2', t3, and t4' to the respective transistors 11 to 14. Drive signal t1 is a pre-drive signal to first high-side transistor 11, drive signal t2' is a pre-drive signal to first low-side transistor 12 (hereinafter also referred to as pre-drive signal t2'), drive signal t3 is a drive signal to second high-side transistor 13, drive signal t4' is a pre-drive signal to second low-side transistor 14 (hereinafter also referred to as pre-drive signal t4'). Although not illustrated in the diagram, control circuit 5a includes therein a high-side driving power supply and a level-shift circuit, and drive signals t1 and t3 are transmitted directly to the gate terminals of first high-side transistor 11 and second high-side transistor 13. First low-side driving circuit 200 turns on or off first low-side transistor 12 by receiving pre-drive signal t2', and second low-side driving circuit 200a turns on or off second low-side transistor 14 by receiving pre-drive signal t4'.

First low-side driving circuit 200 includes resistor 201 connected between the gate and the source of first low-side transistor 12, first driving transistor 202 that is a P-channel MOSFET and is connected so as to short-circuit between the gate terminal of first low-side transistor 12 and control-circuit power supply voltage Vcc, and second driving transistor 203 that is an N-channel MOSFET and is connected so as to short-circuit between the gate and source terminals of first low-side transistor 12. Second driving transistor 203 is one example of a driving switch that is connected between the control terminal and the second terminal of the low-side switching element, and opens or closes according to a drive signal.

First low-side driving circuit 200 also includes: a series circuit of Zener diode 204 with Zener voltage Vz2 and detection resistor 205 connected between the power supply line and the gate terminal of first low-side transistor 12; and comparator 206. The connecting point between Zener diode 204 and detection resistor 205 is connected to the negative input terminal of comparator 206. Although not illustrated in the diagram, voltage Vra is a reference voltage generated from control-circuit power supply voltage Vcc and applied to a positive input terminal of comparator 206. Zener diode 204, detection resistor 205, and comparator 206 are connected between the power supply line and the control terminal of the low-side switching element, and constitute voltage detection circuit 220 that is put into a conducting state when the voltage between the control terminal of the low-side switching element and the power supply line reaches or exceeds a first predetermined value, and outputs a detection signal that is put into the first state when the voltage between the control terminal of the low-side switching element and the power supply line reaches or exceeds a second predetermined value.

In addition, first low-side driving circuit 200 includes AND circuit 207 to which pre-drive signal t2' and the output signal of comparator 206 are input. The output of AND circuit 207 is connected to the gate terminal of second driving transistor 203. AND circuit 207 is one example of a logic circuit that puts the driving switch into an open state regardless of the drive signal when the detection signal from voltage detection circuit 220 is put into the first state.

The configuration of second low-side driving circuit 200a is equivalent to the configuration of first low-side driving circuit 200, and thus detailed illustrations and explanations will be omitted.

In the present working example, power supply voltage Vc which is charged during the conducting phase switching operation is applied to second high-side transistor 13 and first low-side transistor 12, i.e., in the reverse phase with respect to FIG. 2. The following describes the operation of first low-side driving circuit 200 of motor driving device 10b according to the present working example illustrated in FIG. 4 to put first low-side transistor 12 into a conducting state when power supply voltage Vc exceeds a predetermined value.

First, when pre-drive signal t2' is at level L, first driving transistor 202 is in the on-state and the output of AND circuit 207 is also at level L regardless of the output state of comparator 206, and thus second driving transistor 203 is put into an off-state. A gate voltage at the level of control-circuit power supply voltage Vcc is applied to first low-side transistor 12, and the first low-side transistor 12 is put into an on-state. At this time, the gate voltage is also applied to the negative input terminal of comparator 206 via detection resistor 205, and the output of comparator 206 is at level L.

Next, when pre-drive signal t2' is at level H, first driving transistor 202 is in the off-state. Furthermore, when it is in the normal state in which power supply voltage Vc is less than or equal to Zener voltage Vz2 of Zener diode 204, first low-side transistor 12 that is supplied with no voltage to the gate terminal is in the off-state. No voltage greater than or equal to voltage Vra is generated at the negative input terminal of comparator 206, the output of comparator 206 is at level H, the output of AND circuit 207 is at level H, second driving transistor 203 is put into an on-state, and first low-side transistor 12 whose gate terminal is grounded maintains its off-state.

However, when power supply voltage Vc exceeds Zener voltage Vz2 of Zener diode 204 (in other words, the voltage between the power supply line and the control terminal of the low-side switching element reaches or exceeds the first predetermined value), a current flows from the power supply line through Zener diode 204, detection resistor 205, and second driving transistor 203 to the ground, and a voltage is generated in detection resistor 205. When the voltage of detection resistor 205, i.e., the voltage of the negative input terminal of comparator 206 reaches or exceeds voltage Vra (in other words, the voltage between the power supply line and the control terminal of the low-side switching element reaches or exceeds the second predetermined value) as a result of the increase in power supply voltage Vc, the output of comparator 206 is at level L (first state), the output of AND circuit 207 is also at level L, and second driving transistor 203 is put into an off-state. This causes the current flowing through second driving transistor 203 to flow from the power supply line through Zener diode 204, detection resistor 205, and resistor 201, to the ground. As a result, a voltage is generated at the gate terminal of first low-side transistor 12. When this voltage reaches the gate threshold of first low-side transistor 12, first low-side transistor 12 is put into a conducting state, creating a loop for discharging capacitor 3 through first high-side transistor 11 to inhibit the increase in power supply voltage Vc. As a result, the increase in the applied voltage to the switching elements included in the bridge circuit due to regenerative power is inhibited.

In the above-described operations, when the power supply voltage is denoted by Vc, the resistance value of resistor 201 is denoted by R1, the resistance value of detection resistor 205 is denoted by R5, and the gate threshold of first low-side transistor 12 is denoted by Vgth, the relationships between the events and voltage Vc are summarized as follows:

Zener diode 204 and detection resistor 205 are electrically connected: Vc=Vz2;

Comparator 206 is inverted and second driving transistor 203 is turned off: Vc=Vz2+Vra; and First low-side transistor 12 is in a conducting state: Vc=Vz2+(1+R5/R1) Vgth.

At this time, when first high-side transistor 11 is in the on-state by control circuit 5, the discharge current flowing through first low-side transistor 12 exceeds the regenerative current of the motor, and power supply voltage Vc turns from increase to decrease as a result of the discharge of capacitor 3. Then, the gate-source voltage of first low-side transistor 12 also decreases, and when it falls below the gate threshold voltage, first low-side transistor 12 is put into an off-state. As a result, the discharge current of capacitor 3 flowing through first low-side transistor 12 is inhibited from becoming excessive.

When the operation of motor 4 is equivalent to the operation described in the first working example, power supply voltage Vc which is charged during the conducting phase switching operation is applied to first high-side transistor 11 and second low-side transistor 14. In this case, second low-side driving circuit 200*a* operates to put second low-side transistor 14 into a conducting state, thereby inhibiting the increase in power supply voltage Vc. As a result, the increase in the applied voltage to the switching elements included in the bridge circuit due to regenerative power is inhibited.

It should be noted that, as described in the second working example in relation to the first working example, Zener diode 210 included in voltage detection circuit 220 may be connected in parallel with detection resistor 205 in the present working example as well. In FIG. 4, Zener diode 210 is illustrated in parentheses. The operations and advantageous effects are equivalent to those of the second working example, and first low-side transistor 12 is put into a conducting state when power supply voltage Vc reaches Vc=Vz2+Vz0+Vgth where the Zener voltage of Zener diode 210 is Vz0, and thus turning-on of first low-side transistor 12 is unaffected by a resistance value. Furthermore, the subsequent increase in power supply voltage Vc is added to the gate voltage of first low-side transistor 12, and thus the on-resistance between the drain and the source of first low-side transistor 12 rapidly decreases, thereby increasing the discharge current. Thus, the effect of inhibiting the increase in power supply voltage Vc is enhanced. As a result, the increase in the applied voltage to the switching elements included in the bridge circuit due to regenerative power is more reliably inhibited.

As described above, motor driving device 10*b* according to the present working example includes a bridge circuit that includes a plurality of series circuits connected between a power supply line (power supply voltage Vc) and a ground, and is connected to motor 4 at a middle connecting point of each of the plurality of series circuits, the plurality of series circuits each being a series circuit of a high-side switching element (first high-side transistor 11, etc.) and a low-side switching element (first low-side transistor 12, etc.). In motor driving device 10*b* according to the present working example, the low-side switching element includes a first terminal (drain terminal), a second terminal (source terminal), and a control terminal (gate terminal), and has a function of making an electrical connection between the first terminal and the second terminal when a voltage greater than or equal to a predetermined threshold is applied between the control terminal and the second terminal, the first terminal being connected to the high-side switching element, the second terminal being connected to the ground. Motor driving device 10*b* according to the present working example further includes: control circuit 5*a* that outputs a drive signal for driving at least the low-side switching element; voltage detection circuit 220 that is connected between the power supply line and the control terminal of the low-side switching element, is put into a conducting state when a voltage between the power supply line and the control terminal of the low-side switching element reaches or exceeds a first predetermined value, and outputs a detection signal that is put into a first state when the voltage between the power supply line and the control terminal of the low-side switching element reaches or exceeds a second predetermined value; a driving switch (second driving transistor 203) that is connected between the control terminal and the second terminal of the low-side switching element, and opens or closes according to the drive signal; and a logic circuit (AND circuit 207) that puts the driving switch into an open state regardless of the drive signal when the detection signal from voltage detection circuit 220 is put into the first state.

According to this configuration, when the voltage of the power supply line exceeds a predetermined value due to regenerative electric power, the low-side switching element is forced to be in a conducting state, and thus the voltage of the power supply line is inhibited from increasing. As a result, an increase in the applied voltage to the switching elements included in the bridge circuit is inhibited.

In addition, voltage detection circuit 220 includes: a series circuit of a first constant voltage device (Zener diode 204) having the first predetermined value and detection resistor 205; and comparator 206 that compares an electric potential at a connecting point between the first constant voltage device and detection resistor 205 with predetermined reference voltage Vr, and outputs the detection signal. According to this configuration, it is possible to inhibit an increase in the applied voltage to the switching elements due to regenerative electric power, with a simple circuit In addition, voltage detection circuit 220 further includes a second constant voltage device (Zener diode 210) that is connected in parallel with detection resistor 205, and has a voltage higher than predetermined reference voltage Vr. According to this configuration, when the voltage of the power supply line exceeds a predetermined value due to the regenerative electric power, the low-side switching element is forced to put into a conducting state more rapidly, thereby more reliably inhibiting the increase in the voltage of the power supply line.

Fourth Working Example

In the first working example, the first or second high-side transistor is a P-channel MOSFET. However, it is also possible to inhibit an increase in power supply voltage Vc with an N-channel MOSFET.

Figure 5:
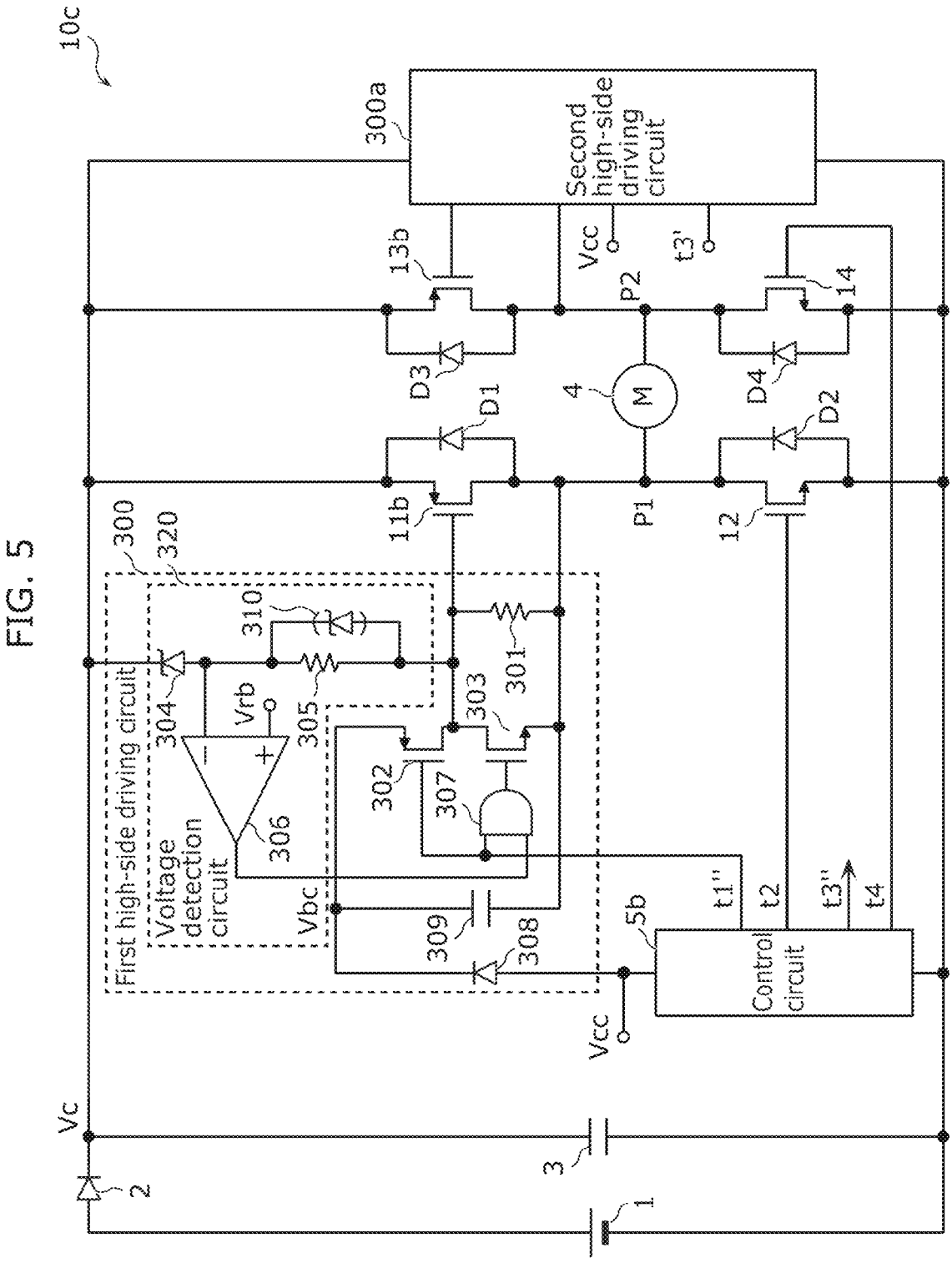
FIG. 5 is a circuit block diagram illustrating a motor driving device according to a fourth working example.

FIG. 5 is a circuit block diagram illustrating motor driving device 10c according to a fourth working example. In FIG. 5, the same structural components are assigned with the same reference signs as in FIG. 1, and redundant descriptions will be omitted. The difference is that the first or second high-side transistor is an N-channel MOSFET, and the first high-side transistor and the second high-side transistor are denoted by 11b and 13b, respectively, so as to distinguish them from those in FIG. 1. The difference is also that control circuit 5 of FIG. 1 is changed to control circuit 5b, and the configurations of first high-side driving circuit 100 and second high-side driving circuit 100a illustrated in FIG. 1 are changed to provide first high-side driving circuit 300 and second high-side driving circuit 300a.

Control circuit 5b operates at control-circuit power supply voltage Vcc and outputs drive signals t1", t2, t3", and t4 to the respective transistors 11b, 12, 13b, and 14. Drive signal t1" is a pre-drive signal to first high-side transistor 11b (hereinafter also referred to as pre-drive signal t1"), drive signal t2 is a drive signal to first low-side transistor 12, drive signal t3" is a pre-drive signal to second high-side transistor 13b (hereinafter also referred to as pre-drive signal t3"), and drive signal t4 is a drive signal to second low-side transistor 14. First high-side driving circuit 300 turns on or off first high-side transistor 11b by receiving pre-drive signal t1", and second high-side driving circuit 300a turns on or off second high-side transistor 13b by receiving pre-drive signal t3". Although not illustrated in the diagram, control circuit 5b includes therein a level-shift circuit, and drive signals t1"

and t3" are converted to signals with the source terminal electric potentials of first high-side transistor 11b and second high-side transistor 13b being the reference potentials.

In first high-side driving circuit 300, high-side driving power supply voltage Vbc is generated by a bootstrap circuit which will be described later. First high-side driving circuit 300 includes resistor 301 connected between the gate and the source of first high-side transistor 11b, first driving transistor 302 that is a P-channel MOSFET and connected so as to short-circuit between the gate terminal of first high-side transistor 11b and high-side driving power supply voltage Vbc, and second driving transistor 303 that is an N-channel MOSFET and connected so as to short-circuit between the gate and source terminals of first high-side transistor 11b. Second driving transistor 303 is one example of a driving switch that is connected between the control terminal and the second terminal of the high-side switching element, and opens or closes according to a drive signal.

First high-side driving circuit 300 also includes: a series circuit of Zener diode 304 with Zener voltage Vz3 and detection resistor 305 connected between the power supply line and the gate terminal of first high-side transistor 11b; and comparator 306. The connecting point between Zener diode 304 and detection resistor 305 is connected to a negative input terminal of comparator 306. Although not illustrated in the diagram, voltage Vrb is a reference voltage generated from high-side driving power supply voltage Vbc and applied to a positive input terminal of comparator 306. Zener diode 304, detection resistor 305, and comparator 306 are connected between the power supply line and the control terminal of the high-side switching element, and constitute voltage detection circuit 320 that is put into a conducting state when the voltage between the power supply line and the control terminal of the high-side switching element reaches or exceeds a first predetermined value, and outputs a detection signal that is put into the first state when the voltage between the power supply line and the control terminal of the high-side switching element reaches or exceeds a second predetermined value.

In addition, first high-side driving circuit 300 includes AND circuit 307 to which pre-drive signal t1" and the output signal of comparator 306 are input. Pre-drive signal t1" is applied to the gate terminal of first driving transistor 302. The output of AND circuit 307 is connected to the gate terminal of second driving transistor 303. AND circuit 307 is one example of a logic circuit that puts the driving switch into an open state regardless of the drive signal when the detection signal from voltage detection circuit 320 is put into the first state.

First high-side driving circuit 300 also includes diode 308 and capacitor 309. Diode 308 and capacitor 309 constitute a bootstrap circuit that generates high-side driving power supply voltage Vbc at capacitor 309 by charging capacitor 309 from control-circuit power supply voltage Vcc via diode 308 when first low-side transistor 12 in ON. The configuration of second high-side driving circuit 300a is equivalent to the configuration of first high-side driving circuit 300, and thus detailed illustrations and explanations will be omitted.

The following describes the operation of motor driving device 10c according to the present working example illustrated in FIG. 5 to put first high-side transistor 11b into a conducting state when power supply voltage Vc exceeds a predetermined value.

First, when pre-drive signal t1" is at level L, first driving transistor 302 is in an on-state, and high-side driving power supply voltage Vbc is applied to the gate terminal of first high-side transistor 11b. However, since first high-side transistor 11*b* is in the on-state at this time, the negative input terminal of comparator 306 is connected to the source terminal of first high-side transistor 11*b* via Zener diode 304, and no voltage is generated. Accordingly, comparator 306 outputs a signal of level H. However, AND circuit 307 to which pre-drive signal t1″ at level L is input outputs a signal of level L, second drive transistor 303 is in the off-state, and first high-side transistor 11*b* maintains its on-state.

Next, when pre-drive signal t1″ is at level H, first driving transistor 302 is in the off-state. Furthermore, when it is in the normal state in which power supply voltage Vc is less than or equal to Zener voltage Vz3 of Zener diode 304, first high-side transistor 11*b* that is supplied with no voltage to the gate terminal is in the off-state. No voltage greater than or equal to voltage Vrb is generated at the negative input terminal of comparator 306, the output of comparator 306 is at level H, the output of AND circuit 307 is at level H, second driving transistor 303 is put into an on-state, and first high-side transistor 11*b* whose gate terminal is grounded maintains its off-state.

However, when power supply voltage Vc exceeds Zener voltage Vz3 of Zener diode 304 (in other words, the voltage between the power supply line and the control terminal of the high-side switching element reaches or exceeds the first predetermined value), a current flows from the power supply line through Zener diode 304, detection resistor 305, second driving transistor 303, and first low-side transistor 12, to the ground, and a voltage is generated in detection resistor 305. When the voltage of detection resistor 305, i.e., the voltage of the negative input terminal of comparator 306 reaches or exceeds voltage Vrb (in other words, the voltage between the power supply line and the control terminal of the high-side switching element reaches or exceeds the second predetermined value) as a result of the increase in power supply voltage Vc, the output of comparator 306 is at level L (first state), the output of AND circuit 307 is also at level L, and second driving transistor 303 is put into an off-state. This causes the current flowing through second driving transistor 303 to flow from the power supply line through Zener diode 304, detection resistor 305, resistor 301, and first low-side transistor 12 to the ground. As a result, a voltage is generated at the gate terminal of first high-side transistor 11*b*. When this voltage reaches a gate threshold of first high-side transistor 11*b*, first high-side transistor 11*b* is put into a conducting state, creating a loop that discharges capacitor 3 to inhibit the increase in power supply voltage Vc. As a result, the increase in the applied voltage to the switching elements included in the bridge circuit due to regenerative power is inhibited.

In the above-described operations, when the power supply voltage is denoted by Vc, the resistance value of resistor 301 is denoted by R1, the resistance value of detection resistor 305 is denoted by R5, and the gate threshold of first high-side transistor 11*b* is denoted by Vgth, the relationships between the events and voltage Vc are summarized as follows:

Zener diode 304 and detection resistor 305 are in a conducting state: Vc=Vz3;

Comparator 306 is inverted and second driving transistor 303 is turned off: Vc=Vz3+Vrb; and First high-side transistor 11*b* is in a conducting state: Vc=Vz3+(1+R5/R1) Vgth At this time, when first low-side transistor 12 is in the on-state by control circuit 5, the discharge current flowing through first high-side transistor 11*b* exceeds the regenerative current of the motor, and power supply voltage Vc turns from increase to decrease as a result of the discharge of capacitor 3. Then, the gate-source voltage of first high-side transistor 11*b* also decreases, and when it falls below the gate threshold voltage, first high-side transistor 11*b* is put into an off-state. As a result, the discharge current of capacitor 3 flowing through first high-side transistor 11*b* is inhibited from becoming excessive.

When the operation of motor 4 is in the reverse phase, the operating current is also reversed, and power supply voltage Vc which is charged during the conducting phase switching operation is applied to second high-side transistor 13*b* and first low-side transistor 12. In this case, second high-side driving circuit 300*a* operates to put second high-side transistor 13*b* into a conducting state, thereby inhibiting the increase in power supply voltage Vc. As a result, the increase in the applied voltage to the switching elements included in the bridge circuit due to regenerative power is inhibited.

It should be noted that, as described in the second working example in relation to the first working example, Zener diode 310 which constitutes voltage detection circuit 320 may be connected in parallel with detection resistor 305 in the present working example as well. In FIG. 5, Zener diode 310 is illustrated in parentheses. The operations and advantageous effects are equivalent to those of the second working example, and first high-side transistor 11*b* is put into a conducting state when power supply voltage Vc reaches Vc=Vz3+Vz0+Vgth where the Zener voltage of Zener diode 310 is Vz0, and thus turning-on of first high-side transistor 11*b* is unaffected by a resistance value. Furthermore, the subsequent increase in power supply voltage Vc is added to the gate voltage of first high-side transistor 11*b*, and thus the on-resistance between the drain and the source of first high-side transistor 11*b* rapidly decreases and increases the discharge current. Thus, the effect of inhibiting the increase in power supply voltage Vc is enhanced. As a result, the increase in the applied voltage to the switching elements included in the bridge circuit due to regenerative power is more reliably inhibited.

As described above, motor driving device 10*c* according to the present working example includes a bridge circuit that includes a plurality of series circuits connected between a power supply line (power supply voltage Vc) and a ground, and is connected to motor 4 at a middle connecting point of each of the plurality of series circuits, the plurality of series circuits each being a series circuit of a high-side switching element (first high-side transistor 11*b*, etc.) and a low-side switching element (first low-side transistor 12, etc.). In motor driving device 10*c* according to the present working example, the high-side switching element includes a first terminal (drain terminal), a second terminal (source terminal), and a control terminal (gate terminal), and has a function of making an electrical connection between the first terminal and the second terminal when a voltage equal to or greater than a predetermined threshold is applied between the control terminal and the second terminal, the first terminal being connected to the power supply line, the second terminal being connected to the low-side switching element. Motor driving device 10*c* according to the present working example further includes: control circuit 5*b* that outputs a drive signal for driving at least the high-side switching element; voltage detection circuit 320 that is connected between the power supply line and the control terminal of the high-side switching element, is put into a conducting state when a voltage between the power supply line and the control terminal of the high-side switching element reaches or exceeds a first predetermined value, and outputs a detection signal that is put into a first state when the voltage between the power supply line and the control terminal of the high-side switching element reaches or exceeds a second predetermined value; a driving switch (second driving transistor 303) that is connected between the control terminal and the second terminal of the high-side switching element, and opens or closes according to the drive signal; and a logic circuit (AND circuit 307) that puts the driving switch into an open state regardless of the drive signal when the detection signal from voltage detection circuit 320 is put into the first state.

According to this configuration, when the voltage of the power supply line exceeds a predetermined value due to regenerative electric power, the high-side switching element is forced to be in a conducting state, and thus the voltage of the power supply line is inhibited from increasing. As a result, an increase in the applied voltage to the switching elements included in the bridge circuit is inhibited.

In addition, voltage detection circuit 320 includes: a series circuit of a first constant voltage device (Zener diode 304) having the first predetermined value and detection resistor 305; and comparator 306 that compares an electric potential at a connecting point between the first constant voltage device and detection resistor 305 with predetermined reference voltage Vr, and outputs the detection signal. According to this configuration, it is possible to inhibit an increase in the applied voltage to the switching elements due to regenerative electric power, with a simple circuit.

In addition, voltage detection circuit 320 further includes a second constant voltage device (Zener diode 310) that is connected in parallel with detection resistor 305, and has a voltage higher than predetermined reference voltage Vr. According to this configuration, when the voltage of the power supply line exceeds a predetermined value due to the regenerative electric power, the high-side switching element is forced to put into a conducting state more rapidly, thereby more reliably inhibiting the increase in the voltage of the power supply line.

Although the motor driving device according to the present disclosure has been described based on the embodiments and working examples thus far, the present disclosure is not limited to these embodiments and working examples described above. Those skilled in the art will readily appreciate that various modifications may be made in these embodiments and working examples and that other embodiments may be obtained by arbitrarily combining the elements of these embodiments and working examples without materially departing from the novel teachings and advantages of the present disclosure. Accordingly, all such modifications and other embodiments are included in the present disclosure.

For example, although the above-described embodiments and working examples according to the present disclosure have been described with a single-phase motor driving device, the motor driving device according to the present disclosure is not limited to this configuration. Since the detection of a power supply voltage and inhibiting an increase in the power supply voltage are configuration to be applied to each of the series circuits of a high-side transistor and a low-side transistor connected between the power supply line and the ground, it should be understood that even a 3-phase driving device, for example, can be provided in each of the series circuits.

In addition, the voltage detection circuit is not limited to the circuit illustrated in each of the working examples. The voltage detection circuit may include a first comparator with a first predetermined value as the threshold, and a second comparator with a second predetermined value as the threshold.

In addition, the comparator included in the voltage detection circuit need not necessarily be an operational amplifier (IC), but may be a discrete circuit including a transistor.

Control circuits 5, 5*a*, and 5*b* each need not necessarily be provided in the motor driving device, but may be an external device that provides a drive signal to the motor driving device. In addition, control circuits 5, 5*a*, and 5*b* may each be an IC, a discrete circuit, or a mixture thereof.

INDUSTRIAL APPLICABILITY

The motor driving device according to the present disclosure can be used as a motor driving device having a function of overvoltage protection, and in particular, as a motor driving device capable of inhibiting an increase in the applied voltage to the switching elements due to regenerative electric power.

The invention claimed is:

1. A motor driving device comprising:
a bridge circuit that includes a plurality of series circuits connected between a power supply line and a ground, and is connected to a motor at a middle connecting point of each of the plurality of series circuits, the plurality of series circuits each being a series circuit of a high-side switching element and a low-side switching element, wherein
the high-side switching element includes a first terminal, a second terminal, and a control terminal, and has a function of making an electrical connection between the first terminal and the second terminal when a voltage greater than or equal to a predetermined threshold is applied between the first terminal and the control terminal, the first terminal being connected to the power supply line, the second terminal being connected to the low-side switching element, and
the motor driving device further comprises:
a control circuit that outputs a drive signal for driving at least the high-side switching element;
a voltage detection circuit that is connected between the control terminal of the high-side switching element and the ground, is put into a conducting state when a voltage between the control terminal of the high-side switching element and the ground reaches or exceeds a first predetermined value, and outputs a detection signal that is put into a first state when the voltage between the control terminal of the high-side switching element and the ground reaches or exceeds a second predetermined value;
a driving switch that is connected between the first terminal and the control terminal of the high-side switching element, and opens or closes according to the drive signal; and
a logic circuit that puts the driving switch into an open state regardless of the drive signal when the detection signal from the voltage detection circuit is put into the first state.

2. The motor driving device according to claim 1, wherein the voltage detection circuit includes: a series circuit of a first constant voltage device having the first predetermined value and a detection resistor; and a comparator that compares an electric potential at a connecting point between the first constant voltage device and the detection resistor with a predetermined reference voltage, and outputs the detection signal.

3. The motor driving device according to claim 2, wherein the voltage detection circuit further includes a second constant voltage device that is connected in parallel with the detection resistor, and has a voltage higher than the predetermined reference voltage.

4. A motor driving device comprising:

a bridge circuit that includes a plurality of series circuits connected between a power supply line and a ground, and is connected to a motor at a middle connecting point of each of the plurality of series circuits, the plurality of series circuits each being a series circuit of a high-side switching element and a low-side switching element, wherein the low-side switching element includes a first terminal, a second terminal, and a control terminal, and has a function of making an electrical connection between the first terminal and the second terminal when a voltage greater than or equal to a predetermined threshold is applied between the control terminal and the second terminal, the first terminal being connected to the high-side switching element, the second terminal being connected to the ground, and the motor driving device further comprises:

a control circuit that outputs a drive signal for driving at least the low-side switching element;

a voltage detection circuit that is connected between the power supply line and the control terminal of the low-side switching element, is put into a conducting state when a voltage between the power supply line and the control terminal of the low-side switching element reaches or exceeds a first predetermined value, and outputs a detection signal that is put into a first state when the voltage between the power supply line and the control terminal of the low-side switching element reaches or exceeds a second predetermined value;

a driving switch that is connected between the control terminal and the second terminal of the low-side switching element, and opens or closes according to the drive signal; and a logic circuit that puts the driving switch into an open state regardless of the drive signal when the detection signal from the voltage detection circuit is put into the first state.

5. The motor driving device according to claim 4, wherein the voltage detection circuit includes: a series circuit of a first constant voltage device having the first predetermined value and a detection resistor; and a comparator that compares an electric potential at a connecting point between the first constant voltage device and the detection resistor with a predetermined reference voltage, and outputs the detection signal.

6. The motor driving device according to claim 5, wherein the voltage detection circuit further includes a second constant voltage device that is connected in parallel with the detection resistor, and has a voltage higher than the predetermined reference voltage.

7. A motor driving device comprising:

a bridge circuit that includes a plurality of series circuits connected between a power supply line and a ground, and is connected to a motor at a middle connecting point of each of the plurality of series circuits, the plurality of series circuits each being a series circuit of a high-side switching element and a low-side switching element, wherein the high-side switching element includes a first terminal, a second terminal, and a control terminal, and has a function of making an electrical connection between the first terminal and the second terminal when a voltage equal to or greater than a predetermined threshold is applied between the control terminal and the second terminal, the first terminal being connected to the power supply line, the second terminal being connected to the low-side switching element, and the motor driving device further comprises:

a control circuit that outputs a drive signal for driving at least the high-side switching element;

a voltage detection circuit that is connected between the power supply line and the control terminal of the high-side switching element, is put into a conducting state when a voltage between the power supply line and the control terminal of the high-side switching element reaches or exceeds a first predetermined value, and outputs a detection signal that is put into a first state when the voltage between the power supply line and the control terminal of the high-side switching element reaches or exceeds a second predetermined value;

a driving switch that is connected between the control terminal and the second terminal of the high-side switching element, and opens or closes according to the drive signal; and a logic circuit that puts the driving switch into an open state regardless of the drive signal when the detection signal from the voltage detection circuit is put into the first state.

8. The motor driving device according to claim 7, wherein the voltage detection circuit includes: a series circuit of a first constant voltage device having the first predetermined value and a detection resistor; and a comparator that compares an electric potential at a connecting point between the first constant voltage device and the detection resistor with a predetermined reference voltage, and outputs the detection signal.

9. The motor driving device according to claim 8, wherein the voltage detection circuit further includes a second constant voltage device that is connected in parallel with the detection resistor, and has a voltage higher than the predetermined reference voltage.

\* \* \* \* \*